(12) United States Patent
Kim et al.

(10) Patent No.: US 12,707,942 B2
(45) Date of Patent: Aug. 11, 2026

(54) SEMICONDUCTOR DEVICE

(71) Applicant: SAMSUNG ELECTRONICS CO., LTD., Suwon-si (KR)

(72) Inventors: Yongho Kim, Suwon-si (KR); Sunoo Kim, Suwon-si (KR); Jinwoo Kim, Suwon-si (KR); Boin Noh, Suwon-si (KR); Sejun Park, Suwon-si (KR); Jaehee Oh, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 384 days.

(21) Appl. No.: 18/424,111

(22) Filed: Jan. 26, 2024

(65) Prior Publication Data

US 2025/0022758 A1 Jan. 16, 2025

(30) Foreign Application Priority Data

Jul. 12, 2023 (KR) ........................ 10-2023-0090554

(51) Int. Cl.
*H01L 21/66* (2006.01)
*H01L 23/00* (2006.01)
(Continued)

(52) U.S. Cl.
CPC ............ *H10P 74/273* (2026.01); *H10P 74/23* (2026.01); *H10W 72/01235* (2026.01); *H10W 72/019* (2026.01); *H10W 72/01931* (2026.01); *H10W 72/01938* (2026.01); *H10W 72/07236* (2026.01); *H10W 72/222* (2026.01); *H10W 72/232* (2026.01); *H10W 72/252* (2026.01); *H10W 72/9223* (2026.01); *H10W 72/923* (2026.01); *H10W 72/926* (2026.01);
(Continued)

(58) Field of Classification Search
CPC ............. H10W 72/222; H10W 72/923; H10W 72/926
See application file for complete search history.

(56) References Cited

U.S. PATENT DOCUMENTS 8,497,200 B2 7/2013 Matejat et al.
9,142,520 B2 9/2015 Topacio et al.
(Continued)

FOREIGN PATENT DOCUMENTS

JP 6729331 B2 7/2020
KR 10-0891526 B1 4/2009

*Primary Examiner* — John A Bodnar
(74) *Attorney, Agent, or Firm* — Sughrue Mion, PLLC

(57) ABSTRACT

A semiconductor device includes a semiconductor substrate, a connection pad disposed on an interlayer insulating layer and electrically connected to an interconnection structure, a passivation layer disposed on the connection pad and having a first opening and a second opening, each exposing at least a portion of the connection pad, a first bump that includes a first lower conductive layer in contact with the connection pad within the first opening and a first upper conductive layer on the first lower conductive layer, and a second bump that includes a second lower conductive layer in contact with the connection pad within the second opening and a second upper conductive layer on the second lower conductive layer. The first and second lower conductive layers include the same material, and the first upper conductive layer and the second upper conductive layer include different materials.

20 Claims, 7 Drawing Sheets

(51) Int. Cl.

| | |
|---|---|
| ***H10P 74/00*** | (2026.01) |
| *H10W 72/00* | (2026.01) |
| *H10W 72/20* | (2026.01) |
| *H10W 72/90* | (2026.01) |
| *H10W 90/00* | (2026.01) |

(52) U.S. Cl.
CPC ...... *H10W 72/934* (2026.01); *H10W 72/9415* (2026.01); *H10W 72/942* (2026.01); *H10W 72/952* (2026.01); *H10W 90/721* (2026.01)

(56) References Cited

U.S. PATENT DOCUMENTS

| | | | | |
|---|---|---|---|---|
| 10,186,462 | B2 | 1/2019 | Yu et al. | |
| 10,797,038 | B2 | 10/2020 | Yu et al. | |
| 2017/0077022 | A1 | 3/2017 | Scanlan et al. | |
| 2020/0303334 | A1* | 9/2020 | Liu | H10W 72/20 |
| 2022/0173063 | A1* | 6/2022 | Li | H10W 72/20 |

* cited by examiner

100'

130P
152' 152p 131H2 (130P1) 131H1
151S 151 121 125
120
131
D3
D2 D1

SEMICONDUCTOR DEVICE

CROSS-REFERENCE TO RELATED APPLICATION

This application claims priority to Korean Patent Application No. 10-2023-0090554, filed on Jul. 12, 2023 in the Korean Intellectual Property Office, the contents of which being incorporated by reference herein in its entirety.

BACKGROUND

Apparatuses and devices consistent with the present disclosure relate to a semiconductor device.

According to the trend for miniaturization and high density of semiconductor devices, connection pads of semiconductor devices are formed to have a finer pitch. The connection pads of the fine pitch are electrically connected to an external device (e.g., a substrate or an interposer) through microbumps. In order to secure the reliability of semiconductor devices, the development of stable microbumps is required.

SUMMARY

It is an aspect to provide a semiconductor device having improved reliability.

According to an aspect of one or more embodiments, there is provided is a semiconductor device comprising a semiconductor substrate including a conductive region; an individual element disposed on the semiconductor substrate, and electrically connected to the conductive region; an interconnection structure electrically connected to the individual element; an interlayer insulating layer covering the individual element and the interconnection structure; a connection pad disposed on the interlayer insulating layer, and electrically connected to the interconnection structure; a passivation layer disposed on the connection pad, and having a first opening and a second opening, each exposing at least a portion of the connection pad; a first bump that includes a first lower conductive layer in contact with the connection pad within the first opening, and a first upper conductive layer on the first lower conductive layer; and a second bump that includes a second lower conductive layer in contact with the connection pad within the second opening, and a second upper conductive layer on the second lower conductive layer, wherein the first lower conductive layer and the second lower conductive layer include the same material, and the first upper conductive layer and the second upper conductive layer include different materials.

According to another aspect of one or more embodiments, there is provided is a semiconductor device comprising a connection pad; and a first bump and a second bump disposed on the connection pad, the first bump being spaced apart from the second bump, wherein the first bump includes a first lower conductive layer in contact with the connection pad and a first upper conductive layer on the first lower conductive layer, the second bump includes a second lower conductive layer in contact with the connection pad and a second upper conductive layer on the second lower conductive layer, the first upper conductive layer includes a tin (Sn)-silver (Ag) alloy, and the second upper conductive layer includes at least one of a nickel (Ni)-tin (Sn) alloy and a copper (Cu)-tin (Sn) alloy.

According to yet another aspect of one or more embodiments, there is provided is a semiconductor device comprising a first connection pad and a second connection pad spaced apart from the first connection pad; a plurality of first bumps disposed on the first connection pad and the second connection pad, each of the plurality of first bumps including a first lower conductive layer in contact with the first connection pad or the second connection pad and a first upper conductive layer on the first lower conductive layer; and a second bump disposed on the first connection pad, and including a second lower conductive layer in contact with the first connection pad and a second upper conductive layer on the second lower conductive layer, wherein each of the plurality of first bumps has a first height and the second bump has a second height, the second height being lower than the first height.

BRIEF DESCRIPTION OF DRAWINGS

The above and other aspects will be more clearly understood from the following detailed description, taken in conjunction with the accompanying drawings, in which.

DETAILED DESCRIPTION

Hereinafter, with reference to the accompanying drawings, various embodiments will be described. Unless otherwise specified, in this specification, terms such as 'upper portion,' 'upper surface,' 'lower portion,' 'lower surface,' 'side surface,' and the like, are based on the drawings, and may actually vary depending on a direction in which the components are arranged.

In addition, an ordinal number such as "first," "second," "third", and the like may be used as a label of specific elements, steps, directions, and the like to distinguish various elements, steps, and directions from each other. Terms not described using "first", "second", and the like, in the specification may still be referred to as "first" or "second" in the claims. Also, a term referenced by a particular ordinal number (e.g., "first" in a particular claim) may be recited elsewhere by a different ordinal number (e.g., "second" in a specification or the other claim). That is, unless specified otherwise, ordinal numbers are not intended to indicate any order to the components so labeled.

As used in this specification, the phrase "at least one of A and B" includes within its scope "only A", "only B" and "both A and B." Similarly, the phrase "at least one of A, B, and C" includes within its scope "only A", "only B", "only C", "A and B", "B and C", "A and C", and "A, B, and C".

Figure 1A:
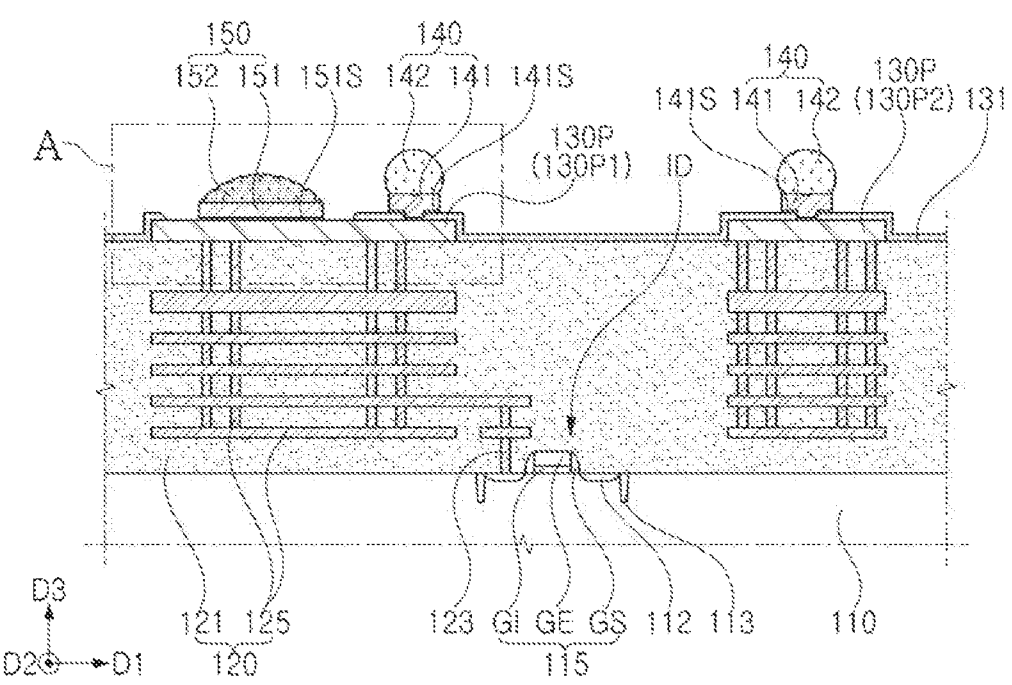
FIG. 1A is a cross-sectional view of a semiconductor device according to an example embodiment.
Figure 1B:
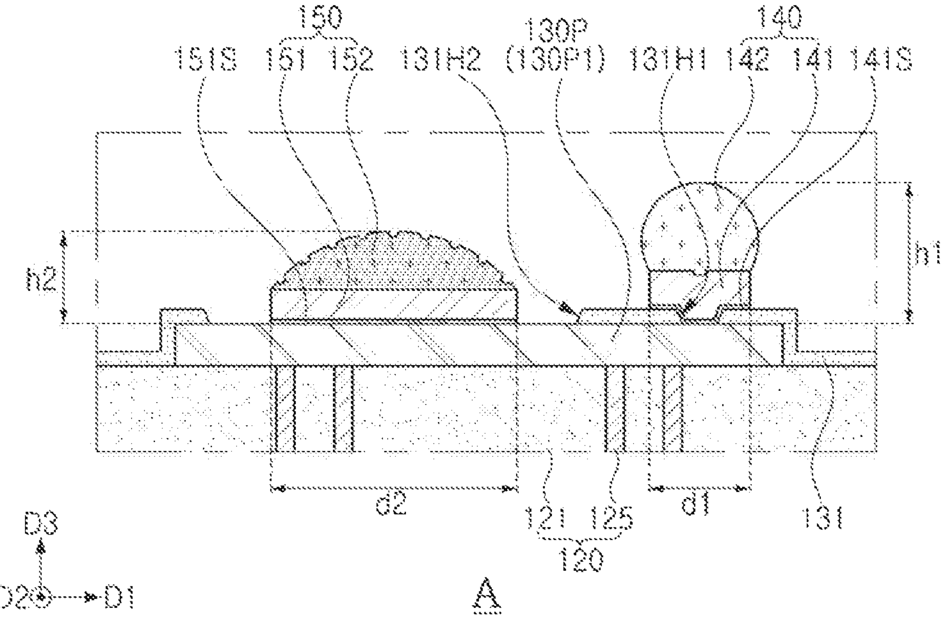
FIG. 1B is a partially enlarged view of region 'A' of FIG. 1A.
Figure 1C:
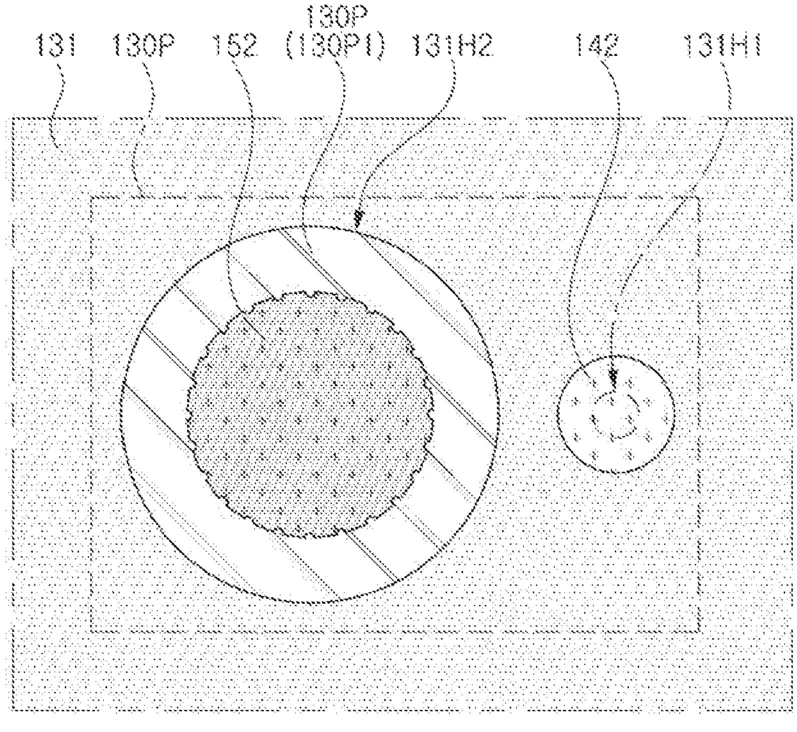
FIG. 1C is a plan view of region 'A' of FIG. 1A.
Figure 1C:

FIG. 1A is a cross-sectional view of a semiconductor device 100 according to an example embodiment, FIG. 1B is a partially enlarged view of region 'A' of FIG. 1A, and FIG. 1C is a plan view of region 'A' of FIG. 1A.

Referring to FIGS. 1A, 1B, and 1C, the semiconductor device 100 according to an example embodiment may include a connection pad 130P, and a first bump 140 and a second bump 150, disposed on the connection pad 130P to be spaced apart from each other.

The semiconductor device 100 may be an IC chip on which an integrated circuit is formed. The semiconductor device 100 may include, for example, a processor chip such as a central processor (CPU), a graphics processor (GPU), a field programmable gate array (FPGA), a digital signal processor, a cryptographic processor, a microprocessor, and a microcontroller, a logic chip such as an analog-to-digital converter, and an application-specific IC (ASIC), or a memory chip including a volatile memory such as dynamic RAM (DRAM), static RAM (SRAM), and the like, and a non-volatile memory such as phase change RAM (PRAM), magnetic RAM (MRAM), Resistive RAM (RRAM), flash memory, and the like. The semiconductor device 100 may further include a semiconductor substrate 110, individual elements ID, and a circuit layer 120.

The semiconductor substrate 110 may be a semiconductor wafer. The semiconductor substrate 110 may include, for example, a semiconductor element such as silicon or germanium, or a compound semiconductor such as silicon carbide (SiC), gallium arsenide (GaAs), indium arsenide (InAs), and indium phosphide (InP). The semiconductor substrate 110 may include a conductive region 112 and an isolation region 113 formed on one surface of the substrate 110. The conductive region 112 may be, for example, a well doped with impurities or a structure doped with impurities. The isolation region 113 may have a device isolation structure having a shallow trench isolation (STI) structure, and may include silicon oxide. A bottom surface of the semiconductor substrate 110, not illustrated in the drawings, may be covered with an insulating film made of a silicon oxide film, a silicon nitride film, a polymer, or a combination thereof.

The individual elements ID may be electrically connected to the conductive region 112 of the semiconductor substrate 110. The individual elements ID may include, for example, FETs such as planar FET, FinFET, or the like, memory devices such as flash memory, DRAM, SRAM, EEPROM, PRAM, MRAM, FeRAM, RRAM, or the like, logic devices such as AND, OR, NOT, or the like, and various active and/or passive elements such as system LSI, CIS, and MEMS. The individual elements ID may include a gate structure 115. The gate structure 115 may include a gate insulating layer GI, a gate electrode GE disposed on the gate insulating layer GI, and a gate spacer GS surrounding the gate insulating layer GI and the gate electrode GE. The gate insulating layer GI may include silicon oxide or silicon nitride. The gate electrode GE may include a semiconductor material, a metal material, or the like. The gate spacer GS may be formed of a silicon oxide layer, a silicon nitride layer, a silicon carbide layer, or a combination thereof.

The circuit layer 120 may be disposed on one surface of the semiconductor substrate 110 on which the conductive region 112 is formed. The circuit layer 120 may include an interlayer insulating layer 121 and an interconnection structure 125. The interlayer insulating layer 121 may be formed to cover the individual elements ID and the interconnection structure 125 to electrically separate the individual elements ID disposed on the semiconductor substrate 110. The interlayer insulating layer 121 may include Flowable Oxide (FOX), Tonen SilaZen (TOSZ), Undoped Silica Glass (USG), Borosilica Glass (BSG), PhosphoSilaca Glass (PSG), BoroPhosphoSilica Glass (BPSG), Plasma Enhanced Tetra Ethyl Ortho Silicate (PETEOS), Fluoride Silicate Glass (FSG), High Density Plasma (HDP) oxide, Plasma Enhanced Oxide (PEOX), Flowable CVD (FCVD) oxide, or a combination thereof. At least a portion of the interlayer insulating layer 121 surrounding the interconnection structure 125 may be formed of a low dielectric layer. The interlayer insulating layer 121 may be formed using a chemical vapor deposition (CVD) process, a flowable-CVD process, or a spin coating process.

The interconnection structure 125 may be formed in a multilayer structure including a plurality of interconnection patterns and a plurality of vias. The interconnection structure 125 may include, for example, aluminum (Al), gold (Au), cobalt (Co), copper (Cu), nickel (Ni), lead (Pb), tantalum (Ta), tellurium (Te), titanium (Ti), tungsten (W), or a combination thereof. A barrier layer (not shown) including titanium (Ti), titanium nitride (TiN), tantalum (Ta), or tantalum nitride (TaN) may be disposed between the interconnection patterns or/and vias and the interlayer insulating layer 121. The interconnection structure 125 may be electrically connected to the individual elements ID by an interconnection portion 123 (e.g., a contact plug).

A connection pad 130P may be disposed on the interlayer insulating layer 121, and electrically connected to the interconnection structure 125. The connection pad 130P may include, for example, aluminum (Al) or an aluminum (Al) alloy, but example embodiments are not limited thereto. According to an embodiment, the connection pad 130P may include a first connection pad 130P1 and a second connection pad 130P2, spaced apart from each other. When the first connection pad 130P1 is a pad for an electrical die sorting (EDS) test and signal transmission and the second connection pad 130P2 is a pad for only signal transmission, both a first bump 140 and a second bump 150 may be formed on the first connection pad 130P1, and only the first bump 140 may be formed on the second connection pad 130P2. A first width of the first connection pad 130P1 may be greater than a second width of the second connection pad 130P2. For example, in a first direction D1, the first width of the first connection pad 130P1 may be within a range of about 40 μm to about 60 μm, and the second width of the second connection pad 130P2 may be within a range of about 10 μm to about 30 μm, but example embodiments are not limited thereto.

The semiconductor device 100 may further include a passivation layer 131 disposed on the connection pad 130P. The passivation layer 131 may extend to cover at least a portion of the connection pad 130P. The passivation layer 131 may include at least one of silicon oxide and silicon nitride. The passivation layer 131 may have a first opening 131H1 and a second opening 131H2 exposing at least a portion of the connection pad 130P (e.g., the first connection pad 130P1), respectively. That is, in some embodiments, the first opening 131H1 and the second opening 131H2 may exposed different portions of the connection pad 130P (e.g., the first connection pad 130P1). For example, when a bump for signal transmission (e.g., a first bump 140) is formed on the first opening 131H1, and a bump for an EDS test (e.g., a second bump 150) is formed on the second opening 131H2, a first diameter of the first opening 131H1 may be smaller than a second diameter of the second opening 131H2. According to an embodiment, the second diameter of the second opening 131H2 may be greater than a width d2 of a second lower conductive layer 151 of the second bump 150.

The first bump 140 may be a bump for transmitting a power signal, a ground signal, a data signal, or the like. The first bump 140 may be disposed on each of the first connection pad 130P1 and the second connection pad 130P2.

The first bump 140 may include a first lower conductive layer 141 in contact with the connection pad 130P and a first upper conductive layer 142 on the first lower conductive layer 141. The first lower conductive layer 141 may contact the connection pad 130P within the first opening 131H1 of the passivation layer 131. The first lower conductive layer 141 may include a via portion penetrating through the first opening 131H1. A first seed layer 141S may be disposed below the first bump 140. The first seed layer 141S may include titanium (Ti), but example embodiments are not limited thereto. The first seed layer 141S may be formed through a plating process, a physical vapor deposition (PVD) process, or a chemical vapor deposition (CVD) process.

The second bump 150 may be a bump for an EDS test. Accordingly, the second bump 150 may be disposed only on a pad for an EDS test, for example, the first connection pad 130P1. The second bump 150 may include a second lower conductive layer 151 in contact with the connection pad 130P and a second upper conductive layer 152 on the second lower conductive layer 151. The second lower conductive layer 151 may contact the connection pad 130P within the second opening 131H2 of the passivation layer 131. According to an embodiment, the second lower conductive layer 151 may have a pad or pillar shape having a flat lower surface. A second seed layer 151S may be disposed below the second bump 150. The second seed layer 151S may include titanium (Ti), but example embodiments are not limited thereto. The second seed layer 151S may be formed through a plating process, a physical vapor deposition (PVD) process, or a chemical vapor deposition (CVD) process.

According to exemplary embodiments, the bump for an EDS test (e.g., the second bump 150) may include an upper conductive layer, formed as an intermetallic compound (IMC) (e.g., the second upper conductive layer 152 may be formed as the intermetallic compound (IMC)), to secure structural stability in a subsequent process. For example, in some example embodiments, in a process of forming the first seed layer 141S after the EDS test (e.g., PVD process) is terminated, a flowdown of the second upper conductive layer 152 may be prevented and the reliability of the semiconductor device 100 may be secured due to the IMC. On the other hand, in some example embodiments, the bump for signal transmission (e.g., the first bump 140) includes an upper conductive layer, not formed as an intermetallic compound (IMC) (e.g., the first upper conductive layer 142 may not be formed as the intermetallic compound (IMC)). The bump for signal transmission (e.g., the first bump 140) may be bonded to a connection terminal of an external device (e.g., a semiconductor chip, a substrate, or the like), by a low-temperature reflow process (see FIG. 5). For example, a first height h1 of the first bump 140 may be higher than a second height h2 of the second bump 150. According to an embodiment, the second upper conductive layer 152, formed as an intermetallic compound (IMC), may have greater surface roughness than the first upper conductive layer 142, not formed as an intermetallic compound (IMC).

The bump for the EDS test (e.g., the second bump 150) may be formed to be greater in size than the bump for signal transmission (e.g., the first bump 140). For example, a first width d1 of the first lower conductive layer 141 may be smaller than a second width d2 of the second lower conductive layer 151. The first width d1 may be within a range of about 10 μm to about 15 μm. In some example embodiments, the first width d1 may be within a range of, for example, about 10 μm to about 14 μm. In some example embodiments, the first width d1 may be within a range of about 11 μm to about 14 μm, etc. However, example embodiments are not limited thereto. The second width d2 may be within a range of about 25 μm to about 35 μm. In some example embodiments, the second width d2 may be within a range of, for example, about 25 μm to about 32 μm. In some example embodiments, the second width d2 may be within a range of about 28 μm to about 32 μm. However, example embodiments are not limited thereto.

The upper conductive layer, formed as an intermetallic compound (IMC) (e.g., the second upper conductive layer 152) and the upper conductive layer, not formed as an intermetallic compound (IMC) (e.g., the first upper conductive layer 142) may include different materials. In some example embodiments, the first lower conductive layer 141 and the second lower conductive layer 151 may include the same material. In some example embodiments, the first upper conductive layer 142 and the second upper conductive layer 152 may include different materials. The first lower conductive layer 141 and the second lower conductive layer 151 may include at least one of nickel (Ni) and copper (Cu), but example embodiments are not limited thereto. In this case, the first upper conductive layer 142 may include solder, and the second upper conductive layer 152 may include at least one of a nickel (Ni)-tin (Sn) alloy and a copper (Cu)-tin (Sn) alloy. For example, the first upper conductive layer 142 may include a tin (Sn)-silver (Ag) alloy, and the second upper conductive layer 152 may include at least one of a nickel (Ni)-tin (Sn) alloy and a copper (Cu)-tin (Sn) alloy.

The upper conductive layer, formed as an intermetallic compound (IMC) (e.g., the second upper conductive layer 152) may have a higher melting point than the upper conductive layer, not formed as an intermetallic compound (IMC) (e.g., the first upper conductive layer 142). For example, a first melting point of the first upper conductive layer 142 may be lower than a second melting point of the second upper conductive layer 152. In some example embodiments, the first melting point may be within a range of about 100° C. to about 300° C. In some example embodiments, the first melting point may be within a range of, for example, about 100° C. to about 250° C. In some example embodiments, the first melting point may be within a range of about 150° C. to about 300° C. In some example embodiments, the first melting point may be within a range of about 200° C. to about 250° C., and the like. However, example embodiments are not limited thereto. In some example embodiments, the second melting point may be within a range of about 400° C. to about 900° C. In some example embodiments, the second melting point may be within a range of, for example, about 400° C. to about 800° C. In some example embodiments, the second melting point may be within a range of about 500° C. to about 900° C. In some example embodiments, the second melting point may be within a range of about 600° C. to about 900° C. In some example embodiments, the second melting point may be within a range of about 600° C. to about 800° C., and the like. However, example embodiments are not limited thereto.

FIGS. 2A to 2G are cross-sectional views illustrating a manufacturing process of a semiconductor device 100 according to an example embodiment.

Figure 2A:
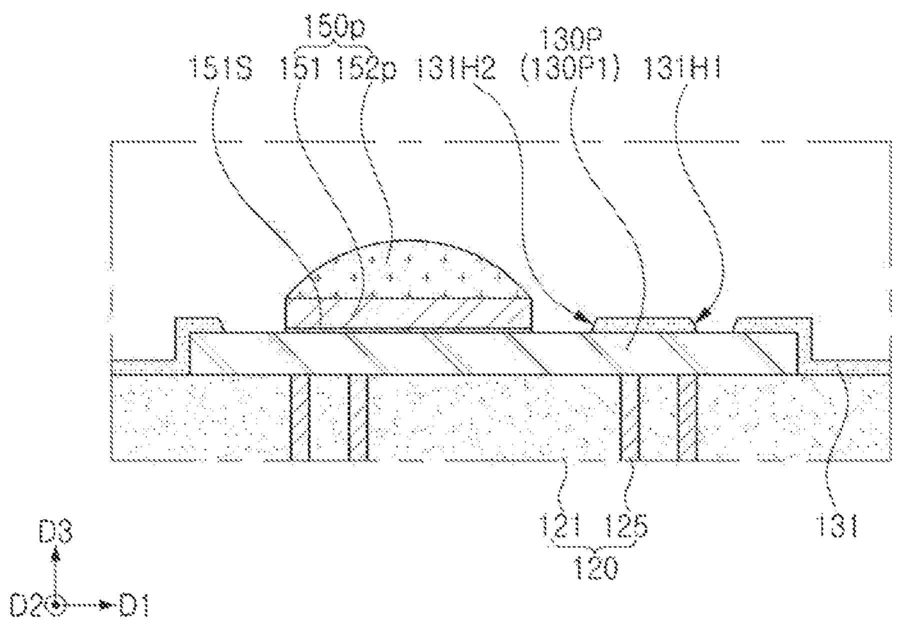
FIGS. 2A to 2G are cross-sectional views illustrating a manufacturing process of a semiconductor device according to an example embodiment.
Figure 2B:
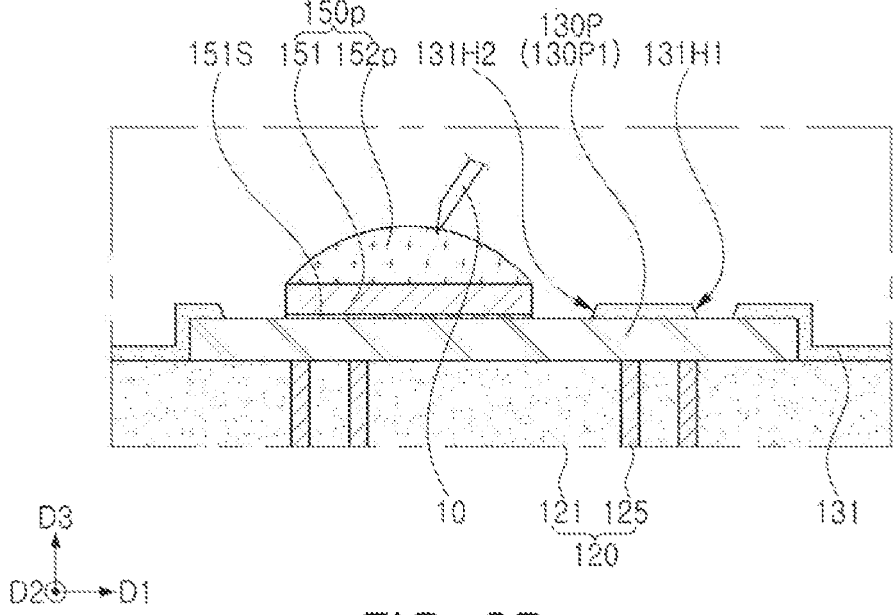
Figure 2C:
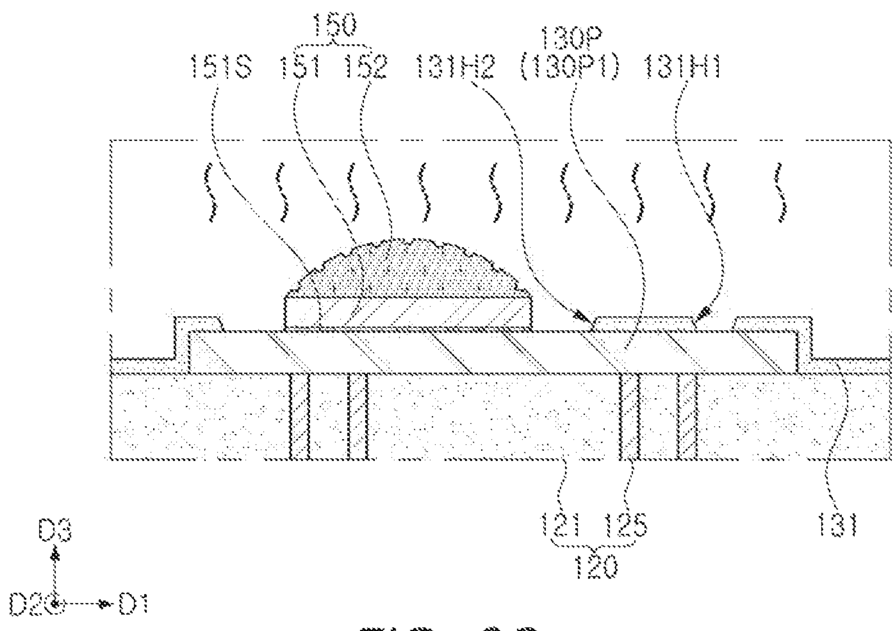
Figure 2D:
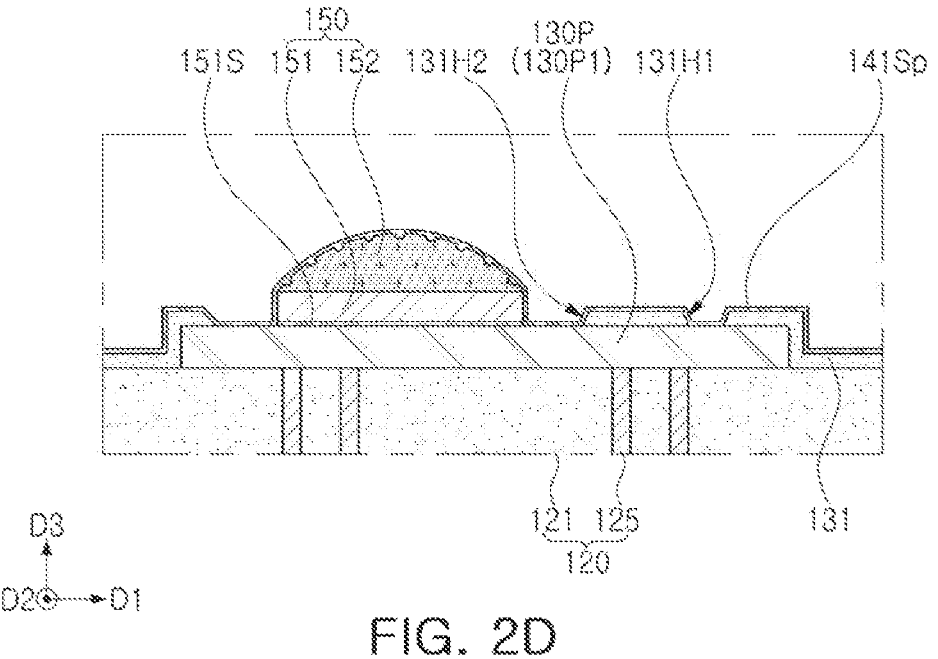
Figure 2E:
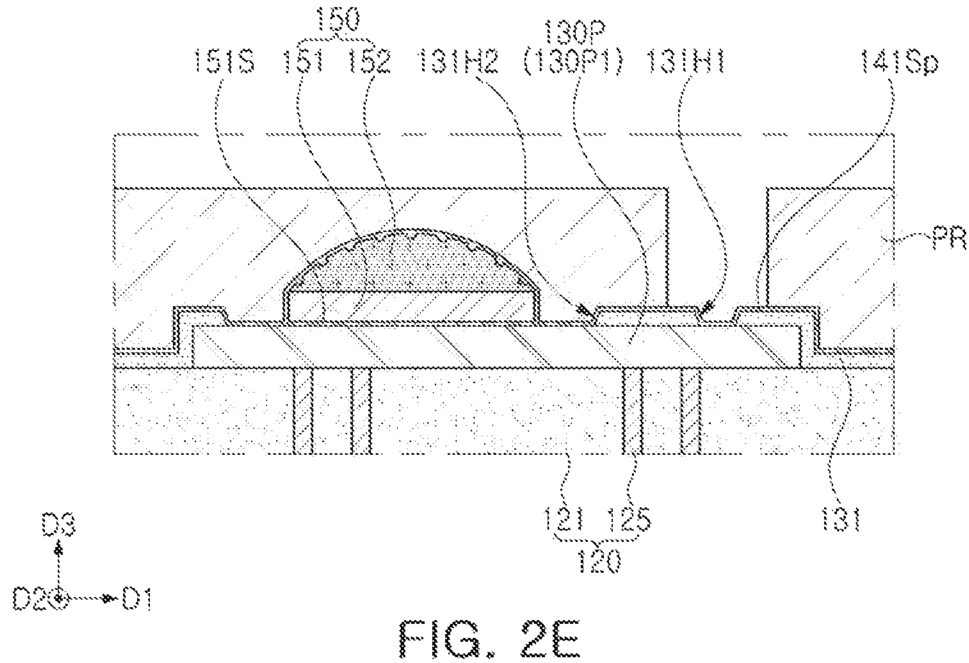
Figure 2F:
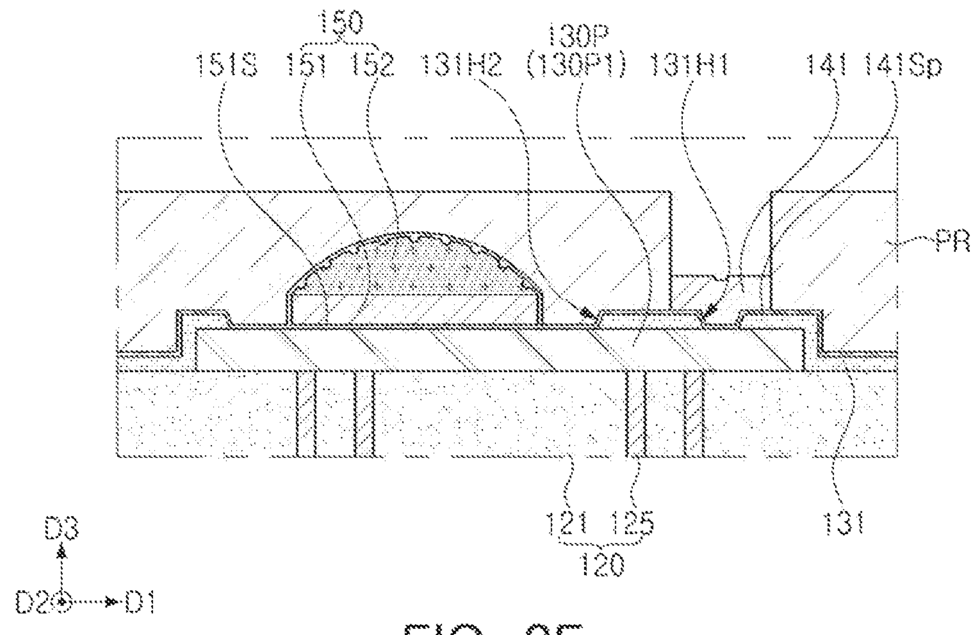
Figures 2G, 3:
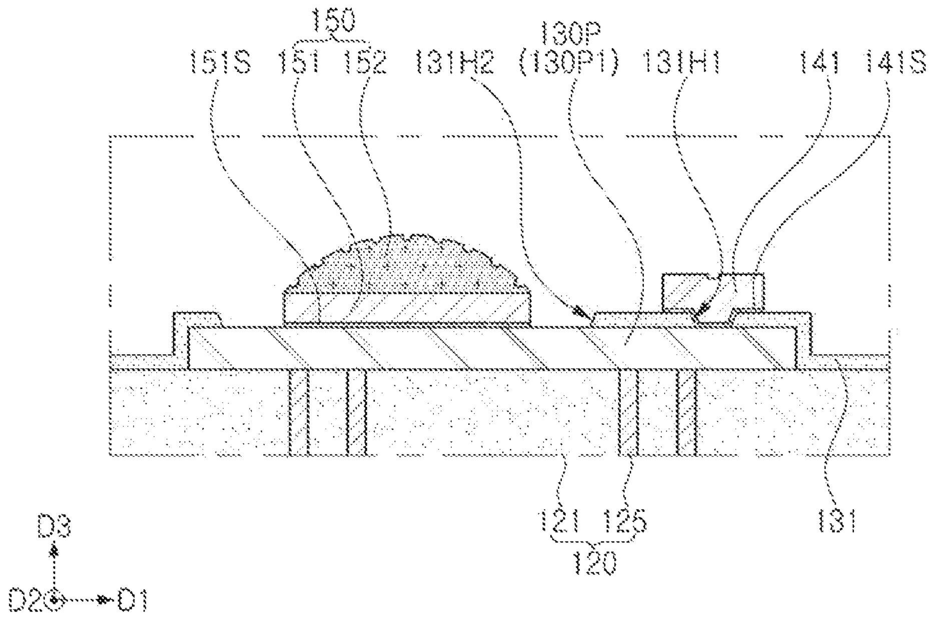
FIG. 3 is a diagram illustrating a manufacturing process of a semiconductor device according to a comparative example.

FIG. 3 is a diagram for illustrating a manufacturing process of a semiconductor device 100' according to a comparative example.

Referring to FIG. 2A, a preliminary bump 150*p* may be formed on a connection pad 130P exposed through a second openings 131H2 of a passivation layer 131.

The passivation layer 131 may include, for example, silicon oxide (SiO) and/or silicon nitride (SiN), and may be formed using a PVD or CVD process. The first opening 131H1 and the second opening 131H2 may be formed by etching at least a portion of the passivation layer 131 formed on the circuit layer 120. For example, a diameter of the first opening 131H1 may be smaller than a diameter of the second opening 131H2.

The preliminary bump 150*p* may include a lower conductive layer 151 and a preliminary upper conductive layer 152*p*. The lower conductive layer 151 may be formed using a plating process, a PVD process, or a CVD process. For example, the lower conductive layer 151 may be formed using an electroplating process using a seed layer 151S. The lower conductive layer 151 may include nickel (Ni) or an alloy thereof. The seed layer 151S may include titanium (Ti) and may be formed using, for example, a PVD process. The preliminary upper conductive layer 152*p* may be formed by attaching solder to the lower conductive layer 151. For example, the preliminary upper conductive layer 152*p* may include a tin-silver alloy.

Referring to FIG. 2B, an EDS test may be performed using the preliminary bump 150*p*. An EDS probe 10 may contact the preliminary upper conductive layer 152*p* of the preliminary bump 150*p*. In some example embodiments, the preliminary upper conductive layer 152*p* may be uncured solder, but example embodiments are not limited thereto.

Referring to FIG. 2C, an upper conductive layer 152 in which the preliminary upper conductive layer 152*p* is formed as an intermetallic compound (IMC), may be formed. The upper conductive layer 152 may be a compound of the preliminary upper conductive layer 152*p* and the lower conductive layer 151. The upper conductive layer 152 may be formed by performing a heat treatment for a time for all the preliminary upper conductive layers 152*p* to be formed as an intermetallic compound (IMC). The upper conductive layer 152 may include, for example, a nickel-tin alloy. Since the upper conductive layer 152 has a high melting point, structural stability of the second bump 150 may be secured in a subsequent process.

Referring to FIG. 2D, a preliminary seed layer 141Sp covering the first opening 131H1 may be formed. The preliminary seed layer 141Sp may include titanium (Ti) and may be formed using, for example, a PVD process. The upper conductive layer 152 of exemplary embodiments may not collapse or flow down during plasma pretreatment for the PVD for forming the preliminary seed layer 141Sp.

Referring to FIG. 3 together, an upper conductive layer 152' of a comparative example may flow down to the outside of the lower conductive layer 151. That is, in a case in which the preliminary upper conductive layer 152*p* is not formed as an intermetallic compound (IMC), the preliminary upper conductive layer 152*p* may flow down during a PVD process for forming a preliminary seed layer 141Sp, which may be a cause of defects and deterioration in reliability. By contrast, as described above, according to exemplary embodiments, an upper conductive layer 152 with structural stability secured may be formed.

Referring to FIG. 2E, a photosensitive material layer PR, patterned on the preliminary seed layer 141Sp, may be formed. The photosensitive material layer PR may be patterned using a photolithography process. The photosensitive material layer PR may be patterned to have a hole having a greater width than the first opening 131H1.

Referring to FIG. 2F, a lower conductive layer 141 may be formed in a hole of the photosensitive material layer PR. The lower conductive layer 141 may be formed using an electroplating process using the preliminary seed layer 141Sp. The lower conductive layer 141 may include nickel (Ni) or an alloy thereof. The lower conductive layer 141 may include a via portion passing through the first opening 131H1.

Referring to FIG. 2G, a seed layer 141S may be formed by removing the photosensitive material layer PR, and etching a portion of the preliminary seed layer 141Sp. Thereafter, an upper conductive layer including solder (e.g., a tin-silver alloy) may be formed on the lower conductive layer 141 to complete the first bump, as illustrated in FIGS. 1A and 1B.

Figure 4:
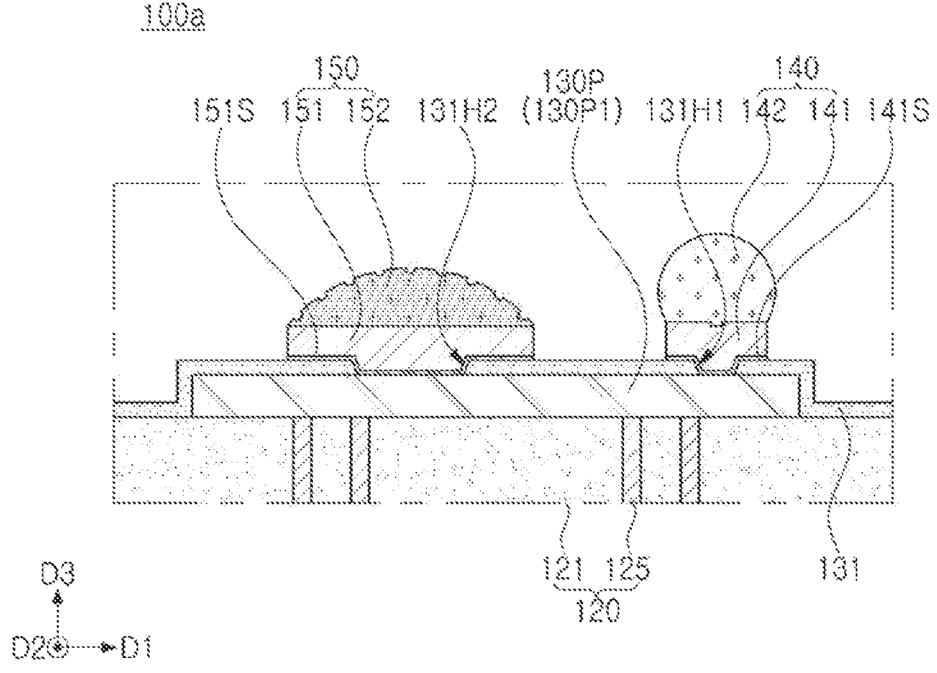
FIG. 4 is a cross-sectional view illustrating a semiconductor device according to an example embodiment.

FIG. 4 is a cross-sectional view illustrating a semiconductor device 100*a* according to an example embodiment.

Referring to FIG. 4, a semiconductor device 100*a* according to an example embodiment may have the same or similar characteristics as those described with reference to FIGS. 1A to 2G, except that a second lower conductive layer 151 includes a via portion. The second lower conductive layer 151 of the second bump 150 may include a via portion penetrating through the passivation layer 131. For example, a diameter of a second opening 131H2 may be smaller than a width of the second lower conductive layer 151. According to an example embodiment, the first lower conductive layer 141 may not include a via portion like the second lower conductive layer 151 shown in FIG. 1B. That is, in some example embodiments, a diameter of the first opening 131H1 may be greater than the width of the first lower conductive layer 141. As described above, the first lower conductive layer 141 and the second lower conductive layer 151 may be deformed into various shapes.

Figure 5:
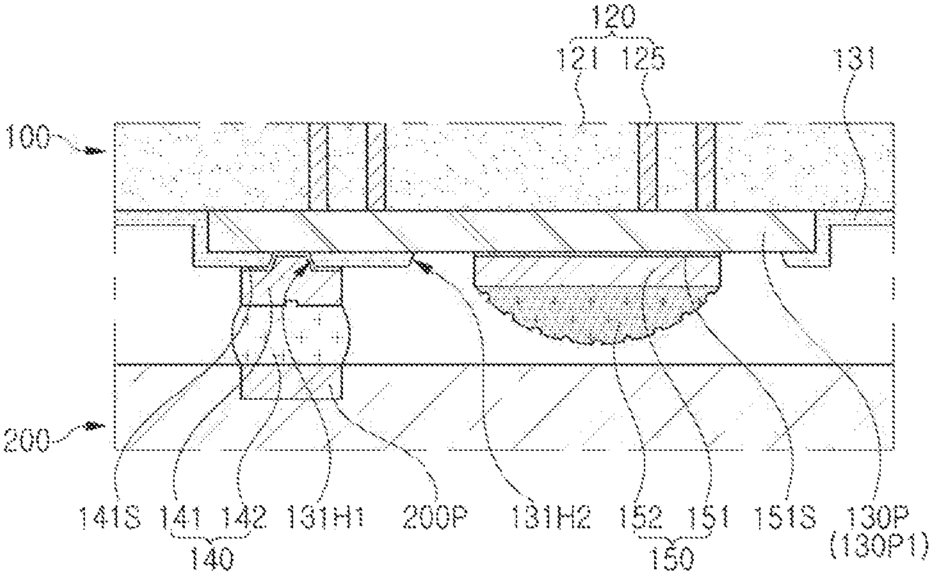
FIG. 5 is a diagram for illustrating a coupling state between a semiconductor device and an external device according to an example embodiment.

FIG. 5 is a diagram for illustrating a coupling state between a semiconductor device 100 and an external device 200 according to an example embodiment.

Referring to FIG. 5, the semiconductor device 100 may be physically and electrically connected to the external device 200 by a first bump 140. The semiconductor device 100 may transmit a power a signal, ground signal, a data signal, and the like, to the external device 200 by the first bump 140, or receive a power signal, ground signal, data signal, and the like, transmitted from the external device 200. The first bump 140 may include a first lower conductive layer 141 in contact with a connection pad 130P and a first upper conductive layer 142 in contact with a connection terminal 200P of the external device 200. The first upper conductive layer 142 may be bonded to the connection terminal 200P through a reflow process. The second bump 150 may include a second upper conductive layer 152, formed as an intermetallic compound (IMC) after an EDS test is performed. The second bump 150 may be formed to have a height, lower than that of the first bump 140 so that a second upper conductive layer 152 is spaced apart from the external device 200, but example embodiments are not limited thereto. The external device 200 may be a semiconductor chip such as a logic chip or a memory chip, or may be an or a substrate for a package for redistributing the connection pad 130P, but example embodiments are not limited thereto.

As set forth above, according to various example embodiments, a semiconductor device having improved reliability may be provided by introducing a bump having stability.

The various and advantageous advantages and effects are not limited to the above description, and may be more easily understood in the course of describing the specific embodiments. While example embodiments have been shown and described above, it will be apparent to those skilled in the art that modifications and variations could be made without departing from the scope of the present disclosure, as defined by the appended claims.

What is claimed is:

1. A semiconductor device comprising:

a semiconductor substrate including a conductive region;

an individual element disposed on the semiconductor substrate, and electrically connected to the conductive region;

an interconnection structure electrically connected to the individual element;

an interlayer insulating layer covering the individual element and the interconnection structure;

a connection pad disposed on the interlayer insulating layer, and electrically connected to the interconnection structure;

a passivation layer disposed on the connection pad, and having a first opening and a second opening, each exposing at least a portion of the connection pad;

a first bump that includes a first lower conductive layer in contact with the connection pad within the first opening, and a first upper conductive layer on the first lower conductive layer; and a second bump that includes a second lower conductive layer in contact with the connection pad within the second opening, and a second upper conductive layer on the second lower conductive layer, wherein the first lower conductive layer and the second lower conductive layer include the same material, and the first upper conductive layer and the second upper conductive layer include different materials.

2. The semiconductor device of claim 1, wherein the first lower conductive layer and the second lower conductive layer comprise at least one of nickel (Ni) and copper (Cu).

3. The semiconductor device of claim 1, wherein the first upper conductive layer comprises solder, and the second upper conductive layer comprises at least one of a nickel (Ni)-tin (Sn) alloy and a copper (Cu)-tin (Sn) alloy.

4. The semiconductor device of claim 1, wherein a first width of the first lower conductive layer is smaller than a second width of the second lower conductive layer.

5. The semiconductor device of claim 4, wherein the first width is within a range of about 10 μm to about 15 μm, and the second width is within a range of about 25 μm to about 35 μm.

6. The semiconductor device of claim 1, wherein a first melting point of the first upper conductive layer is lower than a second melting point of the second upper conductive layer.

7. The semiconductor device of claim 6, wherein the first melting point is within a range of about 100° C. to about 300° C., and the second melting point is within a range of about 400° C. to about 900° C.

8. The semiconductor device of claim 1, wherein the second upper conductive layer has a first surface roughness that is greater than a second surface roughness of the first upper conductive layer.

9. The semiconductor device of claim 1, wherein a first height of the first bump is greater than a second height of the second bump.

10. The semiconductor device of claim 1, wherein the second bump is configured for an electrical die sorting (EDS) test.

11. The semiconductor device of claim 1, wherein the passivation layer comprises at least one of silicon oxide and silicon nitride.

12. The semiconductor device of claim 1, wherein a first diameter of the first opening is smaller than a second diameter of the second opening.

13. The semiconductor device of claim 12, wherein the second diameter of the second opening is greater than a width of the second lower conductive layer.

14. The semiconductor device of claim 12, wherein the second diameter of the second opening is smaller than a width of the second lower conductive layer.

15. The semiconductor device of claim 1, further comprising:

a seed layer disposed below each of the first bump and the second bump.

16. A semiconductor device comprising:

a connection pad; and a first bump and a second bump disposed on the connection pad, the first bump being spaced apart from the second bump, wherein the first bump includes a first lower conductive layer in contact with the connection pad and a first upper conductive layer on the first lower conductive layer, the second bump includes a second lower conductive layer in contact with the connection pad and a second upper conductive layer on the second lower conductive layer, the first upper conductive layer includes a tin (Sn)-silver (Ag) alloy, and the second upper conductive layer includes at least one of a nickel (Ni)-tin (Sn) alloy and a copper (Cu)-tin (Sn) alloy.

17. The semiconductor device of claim 16, wherein the first lower conductive layer and the second lower conductive layer comprise at least one of nickel (Ni) and copper (Cu).

18. A semiconductor device comprising:

a first connection pad and a second connection pad spaced apart from the first connection pad;

a plurality of first bumps disposed on the first connection pad and the second connection pad, each of the plurality of first bumps including a first lower conductive layer in contact with the first connection pad or the second connection pad and a first upper conductive layer on the first lower conductive layer; and a second bump disposed on the first connection pad, and including a second lower conductive layer in contact with the first connection pad and a second upper conductive layer on the second lower conductive layer, wherein each of the plurality of first bumps has a first height and the second bump has a second height, the second height being lower than the first height.

19. The semiconductor device of claim 18, wherein a first width of the first connection pad is greater than a second width of the second connection pad.

20. The semiconductor device of claim 19, wherein the first width is within a range of about 40 μm to about 60 μm, and the second width is within a range of about 10 μm to about 30 μm.

* * * * *